United States Patent [19]
Miwada

[11] Patent Number: 5,220,210
[45] Date of Patent: Jun. 15, 1993

[54] LINEAR IMAGE SENSOR
[75] Inventor: Kazuo Miwada, Tokyo, Japan
[73] Assignee: NEC Corporation, Tokyo, Japan
[21] Appl. No.: 905,865
[22] Filed: Jun. 29, 1992
[30] Foreign Application Priority Data
   Jun. 27, 1991 [JP] Japan .................. 3-155027
[51] Int. Cl.[5] .............. H01L 27/14; H01L 23/48
[52] U.S. Cl. ................... 257/443; 257/459; 257/692; 257/786
[58] Field of Search ........... 257/443, 448, 459, 666, 257/692, 786

Primary Examiner—Mark V. Prenty

[57] ABSTRACT

In a linear image sensor, a circuit region including a number of photosensitive elements is provided at a center zone of the chip in a longitudinal direction of an elongated semiconductor chip. Two groups of bonding pads are locally concentrated in opposite end zones of the elongated chip, respectively. A plurality of bonding stitches formed on a package for supporting the substrate are divided into two arrays which include substantially the same number of bonding stitches and which are located at both sides of the substrate. Thus, an empty area in the chip can be made as small as possible, and therefore, the chip size can be minimized.

6 Claims, 2 Drawing Sheets

LINEAR IMAGE SENSOR

BACKGROUND OF THE INVENTION

1. Field of the invention

The present invention relates to a linear image sensor, and more specifically to a layout of bonding pads and location of bonding stitches in the linear image sensor.

2. Description of related art

In conventional linear image sensors, an image sensor chip, which is generally formed of a semiconductor substrate, has an active area or circuit region including a number of photosensitive elements arranged and aligned in a single straight array. In a typical example, the size of the circuit region is 300 μm × 30,000 μm in a plan view. Namely, the circuit region is extremely oblong. On the other hand, the required number of bonding pads to be formed on the chip is relatively small. Therefore, if the bonding pads were located and distributed at a periphery of the circuit region, a substantial invalid or empty area inevitably occur in a peripheral region of the circuit region.

Japanese Patent Application Laid-open No. Hei 2-065278 published on Mar. 5, 1990 shows some layouts of various elements within the linear image sensor chip for the purpose of making the empty area in the chip as small as possible. In one shown layout, the chip is formed of an elongated semiconductor substrate, and the circuit region including a number of photosensitive elements is provided at a center zone of the chip in a longitudinal direction of the elongated chip. Bonding pads are divided into two groups, which are locally arranged at opposite end zones of the elongated chip, respectively. Since the two groups of bonding pads are concentrated in the opposite end zones of the elongated chip, the empty area of the periphery of the circuit region on the chip can be reduced to some degree.

However, in each opposite end zone of the elongated chip, the bonding pads are arranged in two rows, which are separated from each other in a transverse direction perpendicular to the longitudinal direction of the elongated chip. Therefore, the two rows of the bonding pads require a substantial width, which is considerably larger than the width of the circuit region, with the result that a substantial empty area remains at each side of the circuit region along the longitudinal direction of the circuit region.

On a package substrate for supporting the sensor chip thereon, there are provided a number of bonding stitches to be connected to the bonding pads of the sensor chip through bonding wires. A minimum pitch of the bonding stitches is considerably larger than a minimum pitch of the bonding pads, and this difference in pitch has restricted the location of the bonding pads and the bonding stitches, with the result that the reduction of the length and width of the sensor chip is limited. This means that a substantial empty area still remains in the elongated chip. In addition, the difference in pitch has required a long bonding wire, and in extreme cases, makes it difficult to connect between the bonding pads and the bonding stitches by the bonding wires.

SUMMARY OF THE INVENTION

Accordingly, it is an object of the present invention to provide a linear image sensor which has overcome the above mentioned defect of the conventional one.

Another object of the present invention is to provide a linear image sensor having a minimized empty area on a linear image sensor chip, by a novel layout of bonding pads on the linear image sensor chip and a novel location of bonding stitches on a package substrate for supporting the linear image sensor chip.

The above and other objects of the present invention are achieved in accordance with the present invention by a linear image sensor comprising:

a linear sensor chip formed of an elongated semiconductor substrate and including a circuit region having therein a number of photosensitive elements and located in a center zone of the substrate in a longitudinal direction of the substrate, and a pair of bonding pad groups located in opposite end zones of the substrate and at the outside of opposite ends of the circuit region, each of the bonding pad groups including a plurality of bonding pads formed on the substrate;

a package for supporting the substrate thereon, and including a plurality of bonding stitches formed on the package, the bonding stitches being divided into first and second arrays which include substantially the same number of bonding stitches and which are located in parallel to a longitudinal direction of the substrate so that the first array of bonding stitches are arranged at one side of the substrate, and the second array of bonding stitches are arranged at the other side of the substrate, the bonding stitches being also divided into first and second groups which include substantially the same number of bonding stitches and which are separated from each other in the longitudinal direction of the substrate so that the first group of bonding stitches are positioned in the proximity of one of the end zones of the substrate, and the second group of bonding stitches are positioned in the proximity of the other of the end zones of the substrate; and a number of bonding wires each connecting one of the bonding pads to a corresponding one of the bonding stitches without crossing another bonding wire.

The above and other objects, features and advantages of the present invention will be apparent from the following description of preferred embodiments of the invention with reference to the accompanying drawings.

DESCRIPTION OF THE PREFERRED EMBODIMENTS

Figure 1:
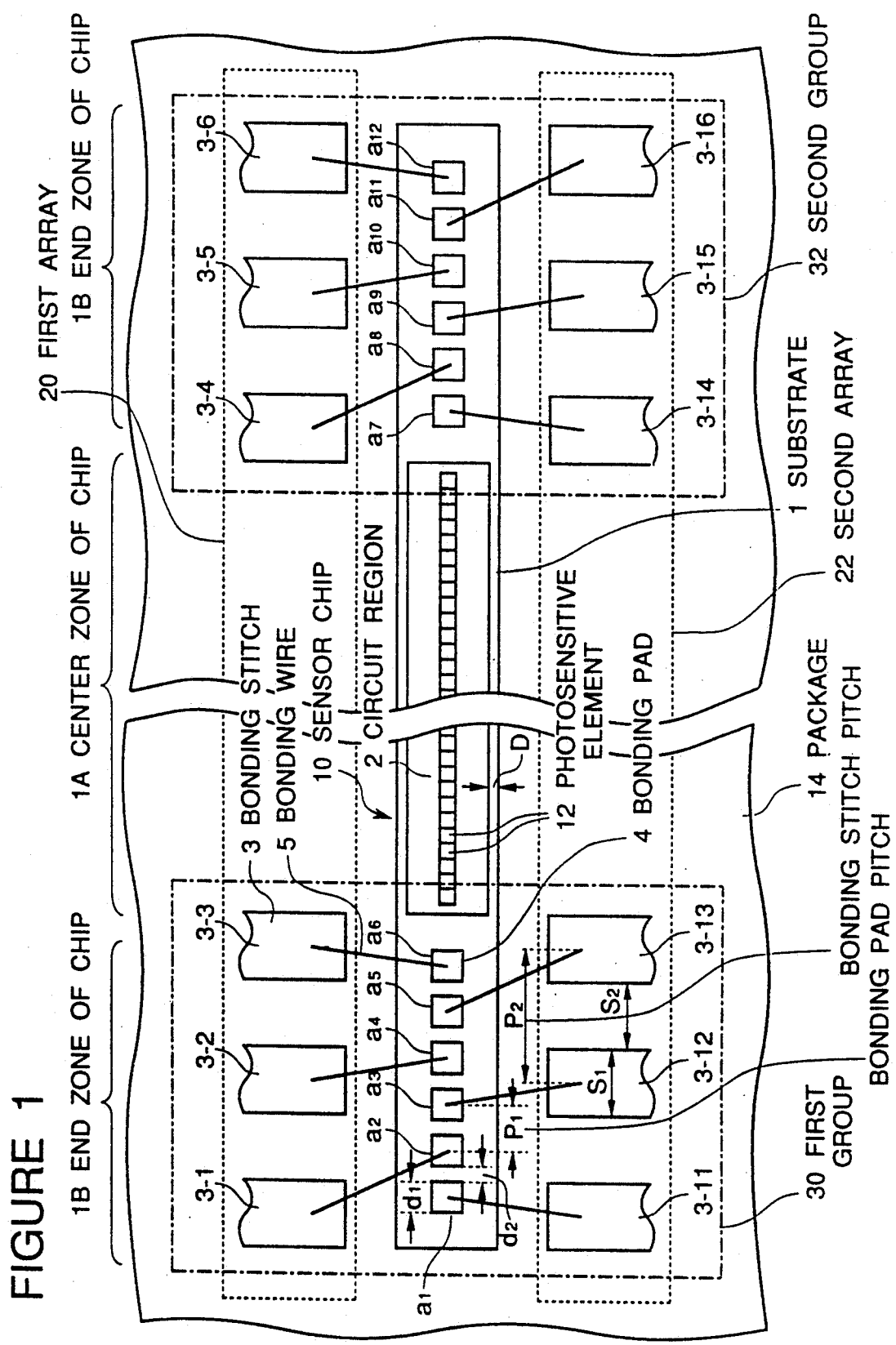
FIG. 1 is a partial diagrammatic plan view of a first embodiment of the linear image sensor in accordance with the present invention.

Referring to FIG. 1, there is shown a partial diagrammatic plan view of a first embodiment of the linear image sensor in accordance with the present invention.

The shown linear image sensor includes a linear image sensor chip 10 formed of an elongated semiconductor substrate 1, a substantial middle portion of which is cut away in the drawing for only simplification of drawing. A circuit region 2 having therein a number of photosensitive elements 12 aligned in a single straight line is located in a center zone 1A of the substrate 1 in a longitudinal direction of the substrate. A pair of bonding pad groups each including a plurality of bonding pads 4 formed on the substrate 1 and arranged in a straight line, are located in opposite end zones 1B and 1C of the substrate 1 and at the outside of opposite ends of the circuit region 2.

On the other hand, a package substrate for supporting the sensor chip 10 thereon is partially shown in the drawing, and generally designated by Reference Numeral 14. This package substrate 14 includes a plurality of bonding stitches (or pads) 3 formed thereon at both sides of the substrate 1 in the following manner: These bonding stitches 3 can be divided into first and second arrays 20 and 22 which include substantially the same number of bonding stitches (six bonding stitches in the shown embodiment) and which are located in parallel to a longitudinal direction of the substrate 1 so that the first array 20 of bonding stitches 3-1, 3-2, 3-3, 3-4, 3-5 and 3-6 are arranged at one side of the substrate, and the second array 22 of bonding stitches 3-11, 3-12, 3-13, 3-14, 3-15 and 3-16 are arranged at the other side of the substrate. In addition, the bonding stitches 3 can be also divided into first and second groups 30 and 32 which include substantially the same number of bonding stitches (six bonding stitches in the shown embodiment) and which are separated from each other in the longitudinal direction of the substrate so that the first group 30 of bonding stitches 3-1, 3-2, 3-3, 3-11, 3-12, and 3-13 are positioned in the proximity of one end zone 1B of the substrate, and the second group 32 of bonding stitches 3-4, 3-5, 3-6 3-14, 3-15 and 3-16 are positioned in the proximity of the other end zone 1C of the substrate.

Each one of the bonding pads 4 is connected to a corresponding one of the bonding stitches 3 by a boding wire 5. Specifically, the bonding pads "$a_1$" to "$a_6$" in the end zone 1B (at a left side of the circuit region 2 in the drawing) are connected to the bonding stitches 3-1, 3-2, 3-3, 3-11, 3-12, and 3-13 included in the first group 30 in such a manner that odd-numbered bonding pads "$a_1$", "$a_3$" and "$a_5$" are connected to the bonding stitches 3-11, 3-12, and 3-13 in the second array 22, respectively, and even-numbered bonding pads "$a_2$", "$a_4$" and "$a_6$" are connected to the bonding stitches 3-1, 3-2 and 3-3 in the first array 20, respectively. The bonding pads "$a_7$" to "$a_{12}$" in the end zone 1C (at a right side of the circuit region 2 in the drawing) are connected to the bonding stitches 3-4, 3-5, 3-6 3-14, 3-15 and 3-16 included in the second group 32 in such a manner that odd-numbered bonding pads "$a_7$", "$a_9$" and "$a_{11}$" are connected to the bonding stitches 3-14, 3-15, and 3-16 in the second array 22, respectively, and even-numbered bonding pads "$a_8$", "$a_{10}$" and "$a_{12}$" are connected to the bonding stitches 3-4, 3-5 and 3-6 in the first array 20, respectively. Thus, each bonding wire can connect each bonding pad to a corresponding bonding stitch with a short distance and without crossing another bonding wire.

As seen from the above, since the pair of bonding pad groups are located in opposite end zones of the elongated substrate 1 and at the outside of longitudinal opposite ends of the circuit region 2, a distance D between each side edge of the substrate 1 and a corresponding side edge of the circuit region 2 can be made sufficiently smaller than a size of the bonding pads. In other words, it is possible to reduce the width of the elongated substrate 1 so as to approach the width of the circuit region. With this arrangement, the empty area at each side of the circuit region 2 can be made to almost zero.

In addition, the bonding stitches 3 are divided into the first array 20 of bonding stitches connected to the even-numbered bonding pads "$a_2$", "$a_4$", "$a_6$", "$a_8$", "$a_{10}$" and "$a_{12}$", and the second array 22 of bonding stitches connected to the odd-numbered bonding pads "$a_1$", "$a_3$", "$a_5$", "$a_7$", "$a_9$" and "$a_{11}$", and the first array 20 of bonding stitches are located on one side of the substrate 1 and the second array 22 of bonding stitches are located on the other side of the substrate 1. With this arrangement, even if the pitch $P_2$ of the bonding stitches 3 were made a double the pitch $P_1$ of the bonding pads 4, it is possible to connect each bonding pad to a corresponding bonding stitch by a bonding wire without any trouble.

In ordinary cases, the width $d_1$ of the bonding pads 4 is on the order of 100 $\mu$m, and the space $d_2$ between each pair of adjacent bonding pads 4 can be narrowed to about 25 $\mu$m. Therefore, it is possible to arrange the bonding pads with the pitch $P_1$ of 125 $\mu$m. On the other hand, the width $S_1$ of the bonding stitches 3 is on the order of 160 $\mu$m, and the space $S_2$ between each pair of adjacent bonding stitches 3 needs at least about 90 $\mu$m. Therefore, in order to arrange the bonding stitches 3, the pitch $P_2$ of at least 250 $\mu$m is required. In the embodiment shown in FIG. 1, the pitch $P_1$ of the bonding pads can be reduced to the minimum pitch of 125 $\mu$m while maintaining the pitch $P_2$ of the bonding stitches 3 at 250 $\mu$m. In other words, it becomes unnecessary to expand the pitch $P_1$ of the bonding pads in order to ensure the minimum pitch $P_2$ of the bonding stitches 3. Accordingly, it is very effective in shortening the length of the sensor chip.

Figure 2:
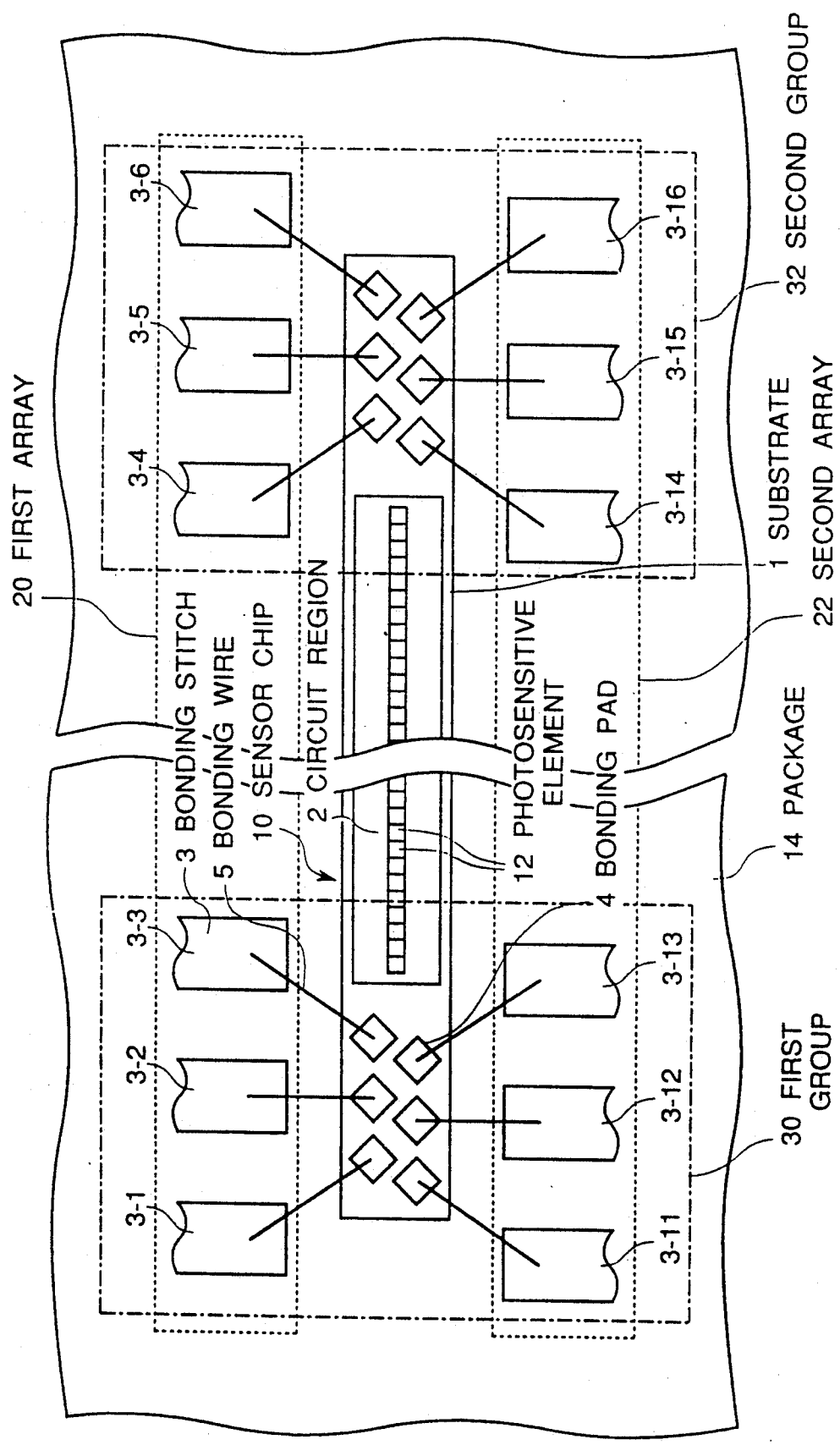
FIG. 2 is a view similar to FIG. 1 but showing a second embodiment of the linear image sensor in accordance with the present invention.

Referring to FIG. 2, there is shown a modification of the embodiment shown in FIG. 1. In the modification, the bonding pads 4 included in each of the boding pad groups are staggered to depict a single zigzag line in the extent of the width of the substrate 1. Each boding pad 4 is in a rectangular shape having each side inclined to the side edge of the substrate by 45°. With this modification, as seen from comparison between FIGS. 1 and 2, the modification shown in FIG. 2 is very effective in reducing the empty area in the periphery of the bonding pads 4. Therefore, it is further effective in shortening the length of the sensor chip.

The invention has thus been shown and described with reference to the specific embodiments. However, it should be noted that the present invention is in no way limited to the details of the illustrated structures but changes and modifications may be made within the scope of the appended claims.

I claim:
1. A linear image sensor comprising:
   a linear image sensor chip formed of an elongated semiconductor substrate and including a circuit region having therein a number of photosensitive elements and located in a center zone of said substrate in a longitudinal direction of said substrate, and a pair of bonding pad groups located in opposite end zones of said substrate and at the outside of longitudinal opposite ends of said circuit region, each of said bonding pad groups including a plurality of bonding pads formed on said substrate;
   a package for supporting said substrate thereon, and including a plurality of bonding stitches formed on said package, said bonding stitches being divided into first and second arrays which include substantially the same number of bonding stitches and which are located in parallel to a longitudinal direction of said substrate so that said first array of bonding stitches are arranged at one side of said substrate, and said second array of bonding stitches are arranged at the other side of said substrate, said bonding stitches being also divided into first and second groups which include substantially the same number of bonding stitches and which are separated from each other in the longitudinal direction of said substrate so that said first group of bonding stitches are positioned in the proximity of one of said end zones of said substrate, and said second group of bonding stitches are positioned in the proximity of the other of said end zones of said substrate; and a number of bonding wires each connecting one of said bonding pads to a corresponding one of said bonding stitches without crossing another bonding wire.

2. A linear image sensor claimed in claim 1 wherein a distance between each side edge of said substrate and a corresponding side edge of said circuit region is smaller than a size of said bonding pads.

3. A linear image sensor claimed in claim 2 wherein in each of said bonding pad groups, said bonding pads are arranged in a single line, and even-numbered bonding pads of said bonding pads on said single line are respectively connected to corresponding ones of said bonding stitches included in said first array, and odd-numbered bonding pads of said bonding pads on said single line are respectively connected to corresponding ones of said bonding stitches included in said second array.

4. A linear image sensor claimed in claim 3 wherein said bonding pads included in each of said bonding pad groups are aligned in a single straight line.

5. A linear image sensor claimed in claim 3 wherein said bonding pads included in each of said bonding pad groups are staggered to depict a single zigzag line.

6. A linear image sensor claimed in claim 5 wherein each of said bonding pads is of a rectangular shape having each side inclined to a side edge of said substrate by 45°.

* * * * *